United States Patent [19]

Mackay

[11] Patent Number: 4,500,149

[45] Date of Patent: Feb. 19, 1985

[54] SOLDER-BEARING LEAD

[75] Inventor: Robert D. Mackay, North Andover, Mass.

[73] Assignee: AT&T Technologies, Inc., New York, N.Y.

[21] Appl. No.: 402,631

[22] Filed: Jul. 28, 1982

[51] Int. Cl.$^3$ ........................ H05K 1/00; H01R 11/22; H01R 4/02

[52] U.S. Cl. .............................. 339/17 C; 339/258 R; 339/275 B

[58] Field of Search ............ 339/17 C, 17 LM, 17 M, 339/258 R, 258 P, 275 R, 275 B, 275 T

[56] References Cited

U.S. PATENT DOCUMENTS

| | | | |
|---|---|---|---|
| 3,351,704 | 11/1967 | Sitzler | 174/84 |
| 3,750,252 | 8/1973 | Landman | 29/191.6 |
| 4,019,803 | 4/1977 | Schell | 339/275B |
| 4,120,558 | 10/1978 | Seidler | 339/275 T |
| 4,203,648 | 5/1980 | Seidler | 339/275 T |
| 4,302,067 | 11/1981 | Monson et al. | 339/275 R |
| 4,345,814 | 8/1982 | Gutbier et al. | 339/275 R |
| 4,357,069 | 11/1982 | Milora | 339/275 R |
| 4,433,892 | 2/1984 | Seidler | 339/258 P |

*Primary Examiner*—John McQuade
*Assistant Examiner*—Gary F. Paumen
*Attorney, Agent, or Firm*—D. D. Bosben

[57] ABSTRACT

A solder-bearing lead (10) includes a contact clamping finger (20) having an arcuate, reverse-bent clamping portion (34) which is wrapped about a solder preform (12) so that a surface portion (22) of the preform directly engages a contact pad (14) on a substrate circuit device (16) when the lead is mounted on the device. When the lead (10) is temporarily subjected to heat in a soldering operation, the solder preform (12) melts and flows directly over the contact pad (14) and then resolidifies to form a soldered connection (26) having an outer end portion (28) of the reverse-bent clamping portion (34) of the contact clamping finger (20) embedded therein.

10 Claims, 3 Drawing Figures

SOLDER-BEARING LEAD

TECHNICAL FIELD

This invention relates to a solder-bearing lead having a solder preform engageable directly with a contact pad, and more particularly to a solder-bearing lead having a contact finger which is wrapped about a solder preform in a direction such that the preform directly engages a contact pad on a substrate circuit device when the lead is mounted on the device.

BACKGROUND OF THE INVENTION

A solder-bearing lead is known in which the lead includes opposed resilient clamping fingers at one end of an elongated stem, with at least one of the fingers defining an electrical contact. The clamping fingers include opposed inner surfaces which define a gap for the reception of a rigid substrate circuit device therebetween, such that the inner surface on the electrical contact clamping finger engages a contact pad on the substrate circuit device. On an outer opposite surface of the contact clamping finger, the contact clamping finger carries a solder preform. The solder preform, upon being temporarily subjected to heat in a soldering operation, initially melts and flows over opposite sides of the contact finger onto the contact pad, and then resolidifies to bond the lead to the contact pad. Solder-bearing leads of this type are shown in U.S. Pat. No. 4,019,803 to M. S. Schell, and U.S. Pat. Nos. 4,120,558 and 4,203,648 to J. Seidler.

Solder-bearing leads as above described normally are fabricated in strip form in a progressive punch-and-die from a strip of phosphorous bronze base metal which has been provided with thin tin coatings on opposite sides thereof, to facilitate the subsequent making of electrical connections to the leads. During the lead fabrication process in the progressive punch-and-die, a continuous solder wire is attached to the contact fingers of the leads and subsequently clipped between the leads to form the solder preforms on the leads. Further, during the lead fabrication process the stems of the leads are formed integrally with an elongated continuous support rail which subsequently is clipped from the stems after the leads have been mounted on a substrate circuit device and soldered to respective contact pads on the device.

In fabricating the solder-bearing leads from a tin-coated phosphorous bronze strip as above-described, while portions of one of the tin coatings are wiped across a portion of the thickness of the base metal so as to coat the base metal, a major portion of the base metal thickness usually is not coated in this manner and is exposed to the atmosphere. When each lead then is mounted on a substrate circuit device the portion of the solder preform held by the contact finger of the lead is separated from the contact pad with which the contact finger is engaged, by phosphorous bronze base metal which, as a result of oxidation from exposure to the atmosphere, is not readily wetted by solder. Accordingly, instead of flowing down onto the contact pad in a soldering operation, the solder from the melted preform normally flows along the solder-wettable tin coating of the lead on the lead stem in a "wicking" action. Similarly, molten solder which does flow down to the contact pad then flows along the solder-wettable tin coating on the opposite side of the lead stem in a "wicking" action. Either flow is undesirable because the solder contaminates the tin coatings on the lead stem, sufficient solder may not be available on the contact pad to form a satisfactory soldered connection between the contact pad and the lead, soldering cycle time is increased, and the use of flux-bearing solder preforms, so as to eliminate undesirable spray fluxing of the assembled leads and substrate circuit devices, is not practical.

A proposed solution to the above-mentioned problems is disclosed in copending patent application Ser. No. 231,569, now U.S. Pat. No. 4,345,814, filed Feb. 4, 1981, in the names of E. A. Gutbier and P. J. Ouellette, assigned to the same assignee as the subject application, and entitled "Solder-Bearing Lead Having Solder Flow-Control Stop Means." In this regard, the E. A. Gutbier et al. application discloses a solder flow-control stop formed on the electrical contact finger of a solder-bearing lead closely adjacent a solder preform to preclude flow of molten solder from the solder preform along the contact finger to the lead stem, and to direct flow of the molten solder directly over the sides of the contact finger by gravity to the contact pad engaged by the finger during a soldering operation. Additional solder flow-control stops also may be formed on the lead to preclude flow of the molten solder along the lead stem during the soldering operation.

Monson et. al. U.S. Pat. No. 4,302,067 discloses a solder-bearing lead in which portions of a solder preform carried on an outer surface of a lead contact finger directly engage a contact pad on a substrate circuit device to facilitate flow of molten solder from the preform over the contact pad in a soldering operation. In this regard, in the Monson et al. patent the contact finger is crimped about the center of the solder preform so as to deform the preform into an hourglass or "bow-tie" configuration such that opposite ends of the preform engage the contact pad when the lead is mounted on the contact pad.

In this regard, a purpose of this invention is to provide a new and improved solder-bearing lead in which a contact finger of the lead is wrapped about a solder preform in a direction such that an increased surface area of the solder preform directly engages a contact pad to which the lead is to be soldered, to facilitate the bonding of the lead to the contact pad.

SUMMARY OF THE INVENTION

In accordance with the invention, a solder-bearing lead comprises an elongated stem and first and second resilient clamping fingers extending in opposed spaced relationship from the elongated stem. A clamping portion of the first resilient clamping finger has an inner surface in opposed spaced relationship to a clamping portion of the second resilient clamping finger. A solder preform is attached to the inner surface of the clamping portion of the first clamping finger such that a surface portion of the solder preform directly engages a contact pad on a substrate when the substrate is received between the finger clamping portions.

More specifically, the clamping portion of the first clamping finger defines an electrical contact which is partially wrapped about the solder preform in clamping relationship in a direction extending toward the clamping portion of the second clamping finger essentially perpendicularly thereto. Thus, as the solder preform melts and resolidifies to bond the contact finger to the contact pad, an outer end portion of the contact finger becomes embedded in the solder in electrical and mechanical contact therewith. Further, the clamping portion of the first clamping finger may be connected to the lead stem by a reverse-bent, essentially U-shaped portion of the clamping finger, with the clamping portion of the first clamping finger being wrapped about the solder preform in a reverse direction with respect to the direction in which the finger connecting portion is reverse-bent from the stem.

DETAILED DESCRIPTION

Figure 1:
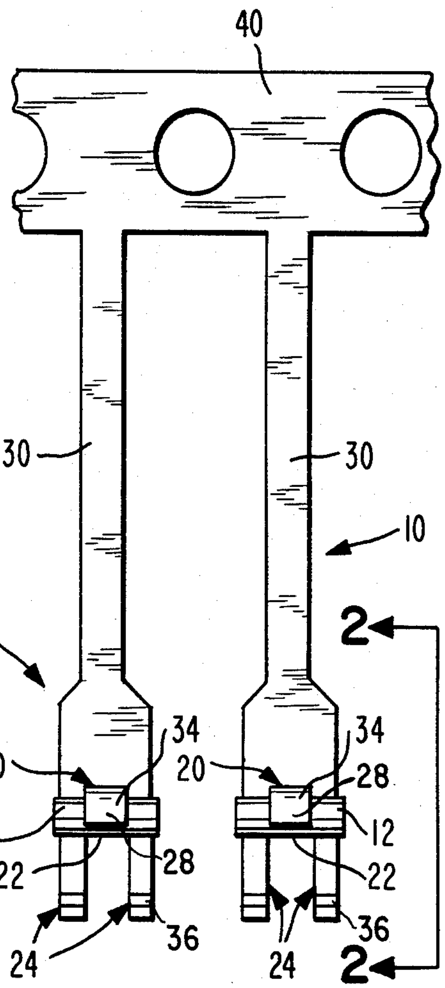
FIG. 1 is an elevational view of a portion of a strip of solder-bearing leads in accordance with the invention.
Figure 2:
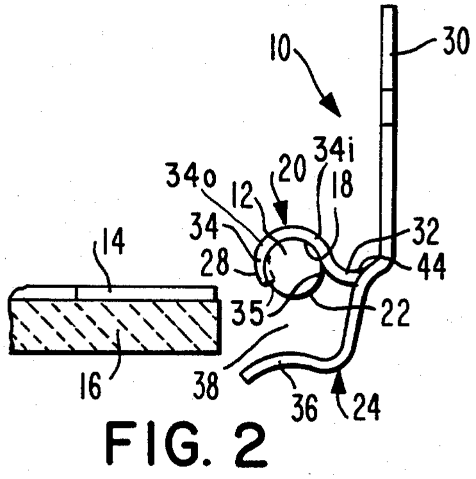
FIG. 2 is a partial side view of a solder-bearing lead in accordance with the invention, looking in the direction of the arrows 2—2 in FIG. 2.
Figure 3:
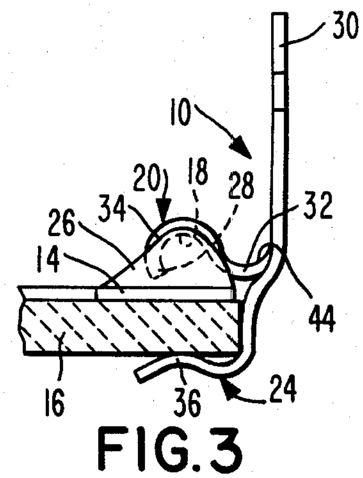
FIG. 3 is a view similar to FIG. 2, showing the solder-bearing lead thereof after the lead has been assembled and soldered to a substrate circuit device.

Referring to FIGS. 1, 2 and 3, the invention as disclosed in these figures is directed to a solder-bearing lead 10 of a type wherein each lead carries a mechanically clamped solder preform 12 (FIGS. 1 and 2), which has an elongated, cylindrical configuration, for bonding the lead to a respective contact pad 14 (one shown in FIGS. 2 and 3) on a rigid substrate circuit device 16. More specifically, the solder preform 12 is carried on an inner surface 18 of a central resilient spring clamping finger 20 of the lead 10 which defines an electrical contact finger having opposite end portions of the preform projecting in a cantilevered fashion from opposite sides of the contact finger. In accordance with this invention, the central contact finger 20 of each lead 10 is wrapped about the solder preform 12 so that a surface portion 22 of the solder preform is in opposed spaced relationship to a pair of outer resilient clamping fingers 24.

Accordingly, when the lead 10 is assembled to the substrate circuit device 16, the surface portion 22 of the solder preform 10 along substantially the entire length of the preform directly engages the associated contact pad 14 on the substrate circuit device. As a result, when the solder preform 12 reaches a molten state in a soldering operation, as soon as the surface tension of the molten solder is reduced sufficiently by associated flux to permit flow of the solder, the preform flows directly over the surface of the contact pad 14 to form a soldered connection 26 between the contact finger 20 of the lead 10 and the contact pad. The resultant soldered connection 26 has at least an outer end portion 28 of the contact finger 20 embedded in the solder, as shown in FIG. 3, to establish an electrical and mechanical connection with the solder. Accordingly, as in the above-mentioned E. A. Gutbier et al. U.S. Pat. No. 4,345,814, a relatively short solder cycle time is required to form the soldered connection 26. In addition, as a result of the molten solder from the solder preform 12 flowing directly over the contact pad 14 to form the soldered connection 26, the soldered connection can be satisfactorily formed using a solder preform of a flux-bearing type without any significant supplemental fluxing.

More specifically, in the disclosed solder-bearing lead 10 the three resilient spring clamping fingers, consisting of the central contact finger 20 and the two outer clamping fingers 24, project essentially perpendicularly from an enlarged end portion of a lead stem 30. The central contact finger 20 includes an essentially U-shaped connecting portion 32 which is reverse-bent with respect to the stem 30 in a first direction, extending away from the outer clamping fingers 24. The central contact finger 20 further includes an arcuate clamping portion 34 which is reverse-bent in a second opposite direction extending toward the outer clamping fingers 24 and mechanically wrapped around the solder preform 12 to attach the preform to the inner surface 18 of the contact finger.

In this regard, as is clearly shown in FIG. 2, the U-shaped connecting portion 32 merges into an inner wrapped section **34*i* of the arcuate clamping portion 34 which extends upwardly in FIG. 2, and the inner wrapped section merges into a reverse-bent outer wrapped section 34*o* which extends downwardly in FIG. 2 and which includes the contact finger outer end portion 28. Further, the outer end portion 28 of the arcuate clamping portion 34 terminates adjacent the contact pad-engageable surface portion 22 of the solder preform 12 in spaced relationship to the inner wrapped section 34*i* of the arcuate clamping portion to define an opening 35 through which the preform surface portion 22 extends downwardly in FIG. 2 toward the outer clamping fingers 24. The surface portion 22 of the solder preform 12 and clamping portions 36 of the outer clamping fingers 24 define respective opposite sides of a gap 38 (FIG. 2) in which the substrate circuit device 16 is receivable between the surface portion of the solder preform and the outer finger clamping portions with a slight force-fit for mounting the lead 10 on the substrate circuit device with the surface portion of the solder preform in firm engagement with a respective one of the contact pads 14. To facilitate retention of the solder preform 12 in the contact finger 20, the outer end portion 28 of the clamping portion 34 may be formed slightly into the solder preform during fabrication of the lead 10**, as shown in FIG. 2.

The stems 30 and the resilient clamping fingers 20 and 24 of the leads 10 are formed of a base metal, such as phosphorous bronze, which is not readily wetted by solder when oxidized as a result of exposure to the atmosphere, and which is coated on opposite surfaces thereof with thin coatings (not shown) of a metal which is readily wetted by solder, such as tin. The tin coatings (not shown) facilitate the making of electrical soldered connections (such as the soldered connections 26) to the leads 10. The stems 30 of the leads 10 also are formed integrally connected to an elongated continuous apertured support rail 40 (FIG. 1) which subsequently is clipped from the stems after the leads 10 have been mounted on the substrate circuit device 16 and soldered to their respective contact pads 14 as shown in FIG. 3.

To preclude the flow of molten solder from the solder preform 12 along the central contact finger 20 to the stem 30, solder-confining stops (not shown) may be formed from oxidized base metal portions on the inner surface 18 and on an outer surface 44 of the contact finger, by removing portions of the above-mentioned solder-wettable metal coatings (not shown) during fabrication of the leads, as disclosed in the above-mentioned E. A. Gutbier application. Similar oxidized base metal solder-confining stops (not shown) may be formed on the outer clamping fingers 24 and/or the stem 30, as desired.

The solder preforms 12 may each consist of an essentially cylindrical piece of a relatively malleable solder wire, such as a 60-40 tin-lead alloy. Preferably, however, the solder preforms 12 are of a flux-bearing type suitable for use in a progressive punch-and-die, such as the number 2879 or number 4147 rosin core solder available from the Alpha Metals Company of Newark, N.J., so as to eliminate or reduce the amount of supplemental spray fluxing required in the soldering of the leads 10.

While the invention has been disclosed as applied to a solder-bearing lead such as the lead 10, in which the clamping portions 34 and 36 of clamping fingers 20 and 24, respectively, extend essentially perpendicularly from one end of the stem 30, it is apparent that the invention also is applicable to other types of solder-bearing leads. For example, the invention may be used on solder-bearing leads of a type in which the clamping portions of the clamping fingers extend substantially parallel to the stem.

In summary, a new and improved solder-bearing lead, such as the lead 10, has been disclosed. With reference to the lead 10, the electrical contact finger 20 is wrapped about the solder preform 12 so that the surface 22 of the preform directly engages the associated contact pad 14 when the lead is mounted on the substrate circuit device 16. As a result, when the solder preform 12 is melted in a reflow-soldering operation, molten solder from the solder preform does not have to initially flow across oxidized side edges of the contact finger 20 to the contact pad 14 by gravity, but rather flows directly over the surface of the contact pad 14. As a result, soldering cycle time is minimized, and the use of flux-bearing solder preforms 12, with the elimination or reduction of undesirable spray fluxing, is facilitated.

What is claimed is:

1. A solder-bearing lead, which comprises:

an elongated stem;

first and second resilient clamping fingers having respective opposed clamping portions extending in opposed spaced relationship from the elongated stem, the clamping portion of the first resilient clamping finger having an inner surface in opposed spaced relationship to an inner surface of the clamping portion of the second resilient clamping finger; and a solder preform attached to the inner surface of the clamping portion of the first resilient clamping finger and having a surface portion disposed in opposed relationship to the inner surface of the clamping portion of the second resilient clamping finger such that the surface portion of the solder preform and the inner surface of the clamping portion of the second resilient clamping finger define respective opposite sides of a gap for receiving a substrate therebetween, and such that the surface portion of the solder preform directly enngages a contact pad on the substrate when the substrate is received between the surface portion of the solder preform and the second clamping portion;

the clamping portion of the first resilient clamping finger being partially wrapped about the solder preform to attach the solder preform to the inner surface of the clamping portion, and the clamping portion including an inner wrapped section which merges into an outer wrapped section having an outer end portion which terminates adjacent the contact pad-engageable surface portion of the solder preform in spaced relationship to the inner wrapped section of the clamping portion to define an opening through which the surface portion of the solder preform extends to define the respective side of the substrate-receiving gap.

2. The solder bearing lead as recited in claim 1, in which:

the clamping portion of the first resilient clamping finger is connected to the lead stem by an essentially U-shaped connecting portion of the clamping finger which is reverse-bent with respect to the stem in a first direction extending away from the clamping portion of the second resilient clamping finger and which merges into the inner wrapped section of the clamping portion of the first resilient clamping finger; and the outer wrapped section of the clamping portion of the first resilient clamping finger is reverse-bent with respect to the U-shaped connecting portion and is wrapped about the solder preform in a second opposite direction extending toward the clamping portion of the second resilient clamping finger.

3. The solder-bearing lead as recited in claim 2, in which:

the clamping portions of the first and second resilient clamping fingers extend essentially perpendicularly from one end of the lead stem.

4. The solder-bearing lead as recited in claim 1, in which:

the solder preform is of elongated construction and the contact pad-engageable surface portion of the solder preform extends essentially along the entire length of the solder preform.

5. A lead-substrate assembly, which comprises:

a lead having an elongated stem and first and second resilient clamping fingers having opposed clamping portions extending in opposed spaced relationship from the elongated stem;

a substrate disposed between the opposed clamping portions of the resilient clamping fingers;

a contact pad on the substrate; and a solder mass bonded to the contact pad on the substrate;

the first resilient clamping finger of the lead further including an essentially U-shaped connecting portion which is reverse-bent with respect to the lead stem in a first direction extending away from the contact pad on the substrate; and the clamping portion of the first resilient clamping finger of the lead having an inner section integral with the reverse-bent connecting portion of the first resilient clamping finger and having an outer section which is reverse-bent with respect to the U-shaped connecting portion and which extends in a second opposite direction toward the contact pad on the substrate, with an outer end portion of the outer wrapped section of the clamping portion terminating adjacent the contact pad and being embedded in the solder mass to form an electrical and mechanical connection therewith.

6. The lead-substrate assembly as recited in claim 5, in which:

the clamping portions of the first and second resilient clamping fingers extend essentially perpendicularly from one end of the lead stem.

7. A solder-bearing lead, which comprises:

an elongated stem;

first and second resilient clamping fingers having respective opposed clamping portions extending in opposed spaced relationship from the elongated stem, the clamping portion of the first resilient clamping finger having an inner surface in opposed spaced relationship to an inner surface of the clamping portion of the second resilient clamping finger; and a solder preform attached to the inner surface of the clamping portion of the first resilient clamping finger and having a surface portion disposed in opposed relationship to the inner surface of the clamping portion of the second resilient clamping finger such that the surface portion of the solder preform and the inner surface of the clamping portion of the second resilient clamping finger define respective opposite sides of a gap for receiving a substrate therebetween, and such that the surface portion of the solder preform directly engages a contact pad on the substrate when the substrate is received between the surface portion of the solder preform and the second clamping portion;

the clamping portion of the first resilient clamping finger being partially wrapped about the solder preform to attach the solder preform to the inner surface of the clamping portion, and the clamping portion including an inner wrapped section which merges into an outer wrapped section;

the clamping portion of the first resilient clamping finger being connected to the lead stem by an essentially U-shaped connecting portion which is reverse-bent with respect to the stem in a first direction extending away from the clamping portion of the second resilient clamping finger and which merges into the inner wrapped section of the clamping portion of the first resilient clamping finger; and the outer wrapped section of the clamping portion of the first resilient clamping finger being reverse-bent with respect to the U-shaped connecting portion and being wrapped about the solder preform in a second opposite direction extending toward the clamping portion of the second resilient clamping finger, with an outer end portion of the outer wrapped section terminating adjacent the contact pad-engageable surface portion of the solder preform in spaced relationship to the inner wrapped section of the clamping portion.

8. The solder-bearing lead as recited in claim 7, in which:

the outer end portion of the outer wrapped section of the clamping portion of the first resilient clamping finger terminates in spaced relationship to the inner wrapped section of the clamping portion to define an opening through which the contact pad-engageable surface portion of the solder preform extends to define the respective side of the substrate-receiving gap.

9. The solder-bearing lead as recited in claim 7, in which:

the clamping portions of the first and second resilient clamping fingers extend essentially perpendicularly from one end of the lead stem.

10. The solder-bearing lead as recited in claim 8, in which:

the solder preform is of elongated construction and the contact pad-engageable surface portion of the solder preform extends essentially along the entire length of the solder preform.

* * * * *